(12) United States Patent
Sawada (10) Patent No.: US 7,482,643 B2
(45) Date of Patent: Jan. 27, 2009

(54) SEMICONDUCTOR DEVICE

(75) Inventor: Ken Sawada, Kanagawa (JP)

(73) Assignee: Sony Corporation, Tokyo (JP)

( * ) Notice: Subject to any disclaimer, the term of this patent is extended or adjusted under 35 U.S.C. 154(b) by 356 days.

(21) Appl. No.: 11/336,333

(22) Filed: Jan. 20, 2006

(65) Prior Publication Data

US 2006/0163610 A1    Jul. 27, 2006

(30) Foreign Application Priority Data

Jan. 26, 2005    (JP) .......................... P2005-017624

(51) Int. Cl.
*H01L 29/737*    (2006.01)
(52) U.S. Cl. ............... 257/197; 257/198; 257/E29.188; 257/E29.189
(58) Field of Classification Search .............. 257/197, 257/198, E29.188, E29.189
See application file for complete search history.

(56) References Cited

U.S. PATENT DOCUMENTS 6,768,141 B2    7/2004  Bahl et al.

2004/0065363 A1*  4/2004  Fetzer et al. ................ 136/262
2005/0158942 A1*  7/2005  Welser et al. ............... 438/235

FOREIGN PATENT DOCUMENTS

| JP | 04-251934 | | 9/1992 |
| JP | 05304165 | A * | 11/1993 |
| JP | 2004-88107 | | 3/2004 |

* cited by examiner

*Primary Examiner*—Minh-Loan T Tran
*Assistant Examiner*—Leslie Pilar Cruz
(74) *Attorney, Agent, or Firm*—Bell, Boyd & Lloyd LLP (57) ABSTRACT

A semiconductor device is provided. In one example, a semiconductor device has a D-HBT structure which include a base layer formed from InGaAs and an emitter layer and a collector layer both formed from InGaP in such a way as to hold said base layer between them, wherein said InGaAs has a composition such that the content of In is smaller than 53% and said InGaP has a composition such that the content of In is just enough to make the lattice constant of said emitter layer and collector layer equal to the lattice constant of said base layer. This semiconductor device realizes a large current gain while keeping the high-speed operation owing to the base layer of InGaAs having good carrier mobility. In addition, it can be formed on a large wafer as the substrate.

7 Claims, 8 Drawing Sheets

PRIOR ART

SEMICONDUCTOR DEVICE

CROSS REFERENCES TO RELATED APPLICATIONS

The present application claims priority to Japanese Patent Application JP 2005-017624 filed in the Japanese Patent Office on Jan. 26, 2005, the entire contents of which being incorporated herein by reference.

BACKGROUND

The present application relates to a semiconductor device, particularly to that of double heterojunction bipolar transistor.

Among high-power high-voltage amplifier devices are double heterojunction bipolar transistors (D-HBT for short hereinafter). They are classified into InGaAs/InP type and GaAs/InGaP or GaAs/AlGaAs type. The former is composed of the substrate of InP, the emitter and collector layers of InP, and the base layer of InGaAs, with lattice matching between the substrate and the layer placed thereon. The latter employs a substrate of GaAs, with lattice matching between the substrate and the layer placed thereon. The former is expected to excel the latter in performance (high speed operation and high voltage) because InP (for the emitter and collector layers) has a large band gap and a great carrier mobility (in the high field region) and InGaAs (for the base layer) has a greater carrier mobility than GaAs.

In the D-HBT of InGaAs/InP type constructed as mentioned above, the InGaAs base layer contains as much In as about 53% for lattice matching with the InP substrate. This makes the conduction band discontinuous between the emitter layer and the base layer or between the base layer and the collector layer, resulting in a spike-like energy barrier in their respective interfaces. The barrier existing in the emitter-base interface causes an offset voltage in the collector current-voltage characteristics, resulting in a dull rise current. In addition, the spike-like barrier existing in the base-collector interface limits the collector current, which leads to an increased power consumption at the time of operation with a large output.

Figure 9:
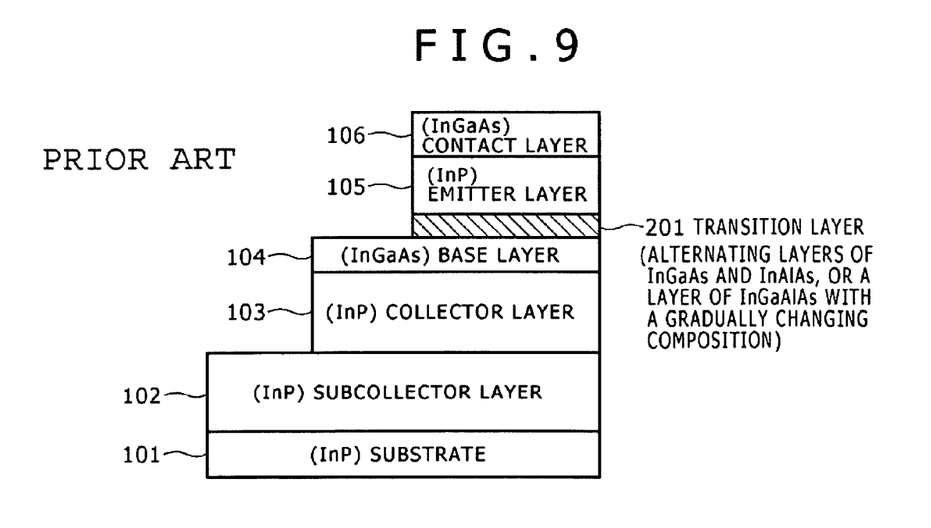
FIG. 9 is a sectional view showing the structure of an example of the conventional D-HBT structure.

One way to eliminate the discontinuity of conduction band between the emitter layer and the base layer and between the base layer and the collector layer, thereby removing the spike-like barrier, is to insert a transition layer between the emitter layer and the base layer and between the base layer and the collector layer, thereby making the conduction band continuous. An example of D-HBT of InGaAs/InP type with a transition layer is shown in FIG. 9 (which is a schematic sectional view). The D-HBT of InGaAs/InP type shown in FIG. 9 consists of InP substrate 101, InP sub-collector layer 102, InP collector layer 103, InGaAs base layer 104, transition layer 201, InP emitter layer 105, and InGaAs contact layer 106, which are arranged sequentially on top of the other.

The transition layer 201 is composed of alternately arranged layers of InGaAs and InAlAs. Alternatively, it is a layer of InGaAlAs with graded composition. The foregoing structure may be modified such that a thin sheet of dopant atoms is interposed between the emitter layer 105 and the transition layer 201, for example, Japanese Patent Laid-open No. 2004-88107.

There is another idea of improving operation speed and reducing offset voltage by forming a contact area from InP and InGaAs in superlattice structure between the collector layer and the base layer; the contact area produces a pseudo smooth connection between the conduction bands for example, Japanese Patent Laid-open No. Hei-4-251934.

In the case of D-HBT of InGaAs/InP type having lattice matching with the InP substrate as mentioned above, the base layer (InGaAs) contains as much In as about 53%, and the InGaAs compound of such a composition has an Auger recombination coefficient of $7 \times 10^{-29}$ cm$^6$/s, which is larger than that of GaAs ($1 \times 10^{-30}$ cm$^6$/s). Therefore, the heavily doped InGaAs base layer has a higher recombination probability than the GaAs base layer.

The result of the foregoing is that the D-HBT of InGaAs/InP type with the InGaAs base layer has a smaller current gain than the D-HBT of GaAs/InGaP type or GaAs/AlGaAs type with the GaAs base layer.

Moreover, in the case of D-HBT of InGaAs/InP type having lattice matching with the InP substrate, the available wafer for the InP substrate is not so large as that for the GaAs substrate, and hence the D-HBT of InGaAs/InP type is more expensive than that of GaAs/InGaP type. For solution to these problems, there has been proposed a D-HBT of InGaAs/InP type which is formed on a GaAs substrate, with a metamorphic buffer layer interposed between them.

The disadvantage of this D-HBT is that forming the InGaAs/InP layer on the GaAs substrate in such a way as to achieve lattice matching with the InP substrate results in a large number of crystal defects at the time of crystal growing due to the large difference in lattice constant. This leads to the low yields and poor reliability of the semiconductor device formed thereon.

SUMMARY

In an embodiment, a semiconductor device of D-HBT structure is provided with a base layer of InGaAs, which provides a large current gain at a high operating speed owing to the outstanding carrier mobility of InGaAs and which can be formed on a large wafer.

The above mentioned embodiment is directed to a semiconductor device which includes a base layer formed from InGaAs and an emitter layer and a collector layer both formed from InGaP in such a way as to hold said base layer between them, wherein said InGaAs has a composition such that the content of In is smaller than 53% and said InGaP has a composition such that the content of In is just enough to make the lattice constant of said emitter layer and collector layer equal to the lattice constant of said base layer.

The semiconductor device specified above may further include a graded layer formed from InGaAsP at least between the base layer and the collector layer and between the base layer and the emitter layer, wherein said InGaAsP has a composition which so varies in As content and P content as to eliminate the discontinuity of the conduction bands between these layers.

The semiconductor device constructed as mentioned above has a base layer formed from InGaAs in which the In content is smaller than 53%. In other words, it differs from the ordinary D-HBT of InP type having a base layer formed form InGaAs in which the In content is set at 53% for lattice matching with the InP substrate. That is, according to an embodiment, the base layer is formed from InGaAs in which the In content is smaller than 53%. The base layer with such a specific In content is realized by holding the base layer between a collector layer and an emitter layer which are formed from InGaP, so that the collector layer and emitter layer have the same lattice constant as the base layer.

The base layer with an In content smaller than 53% has a lower probability of recombination than the base layer of the conventional D-HBT of InP type formed on an InP substrate, which leads to an increased current gain. It also maintains a higher value of carrier mobility than the D-HBT with a base layer of GaAs. This is because InGaAs constituting the base layer permits its coefficient of Auger recombination to approach that of GaAs as its In content decreases.

According to an embodiment, the collector layer and the emitter layer are also formed from InGaAs which has an In content such that they have the same lattice constant as the base layer. Consequently, the collector layer, base layer, and emitter layer (which are grown on the substrate) have a lattice constant closer to that of the GaAs substrate or InGaAs substrate as compared with the case in which the base layer is formed from InGaAs with an In content of 53%. This results in a smaller difference in lattice constant between the GaAs substrate (which is formed on a larger wafer than the InP substrate) and the layers grown thereon. The reduced lattice constant permits defect-free high-quality layers to be grown on a large wafer as the GaAs substrate.

As mentioned above, the semiconductor device according to the embodiment has a base layer formed from InGaAs with an In content smaller than 53% and an emitter layer and a collector layer, both having the same lattice constant as the base layer. As compared with the conventional D-HBT of InGaAs/InP type formed on the InP substrate, it produces a higher current gain while keeping its high operating speed. In addition, it contributes to cost reduction because it can be formed on a large wafer.

Additional features and advantages are described herein, and will be apparent from, the following Detailed Description and the figures.

DETAILED DESCRIPTION

The semiconductor device according to embodiments of the present invention will be described in more detail with reference to the accompanying drawings.

The First Embodiment

Figure 1:
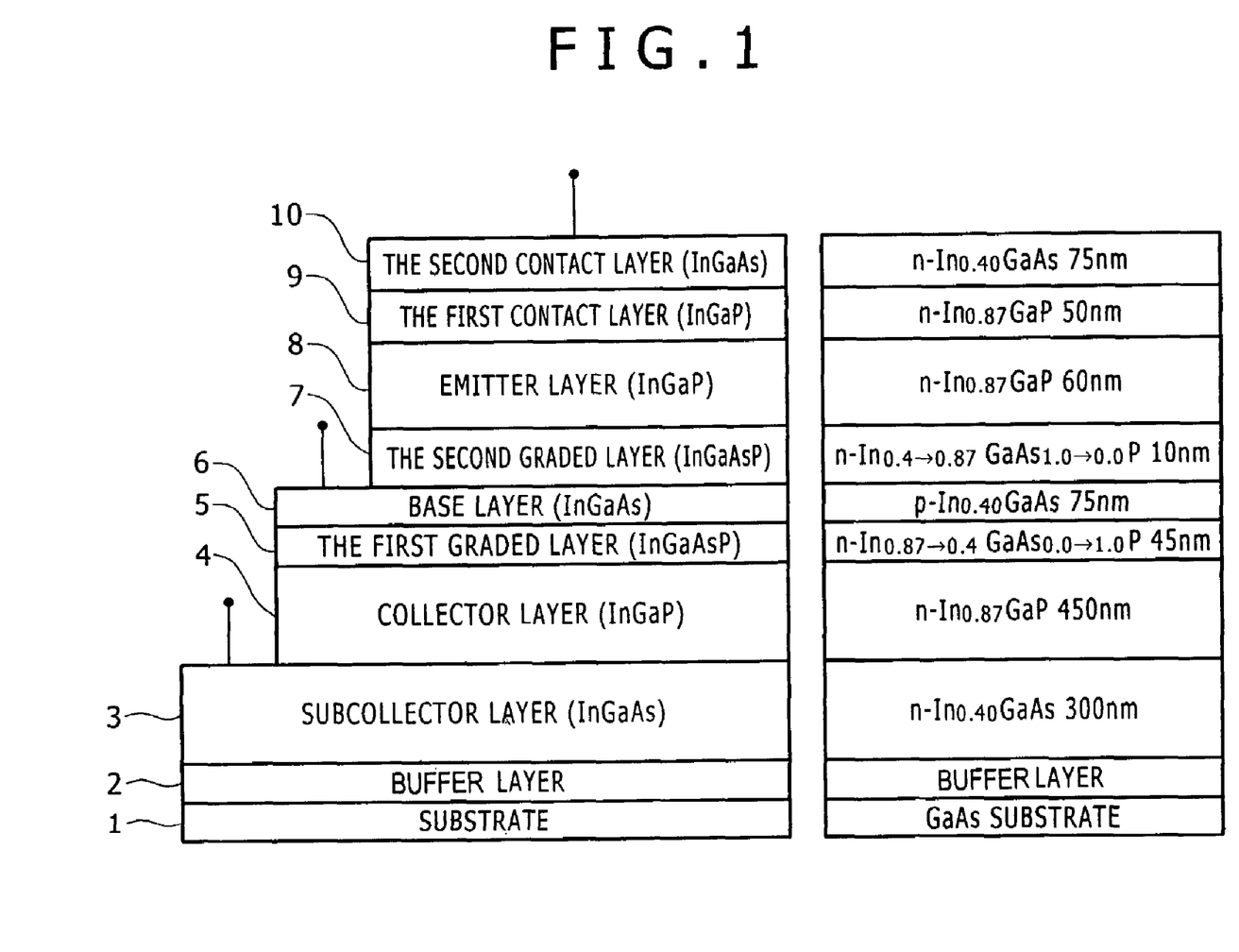
FIG. 1 is a sectional view showing the structure of the semiconductor device according to the first embodiment.

FIG. 1 is a sectional view showing the structure of the semiconductor device according to the first embodiment. Incidentally, the right part of the figure shows an example of the composition of each layer.

The semiconductor device shown in FIG. 1 is a so-called D-HBT. It is composed of a substrate 1 and epitaxially grown layers placed thereon one over another. In other words, the substrate 1 supports a buffer layer 2, a subcollector layer 3, a collector layer 4, a first graded layer 5, a base layer 6, a second graded layer 7, an emitter layer 8, a first contact layer 9, and a second contact layer 10, which are sequentially arranged upward thereon.

The substrate 1 supporting the laminate structure mentioned above may be any of GaAs substrate, InP substrate (with an In content of 53%), InGaAs substrate, and InGaP substrate. The InGaAs substrate should have an In content larger than 0% and smaller than 53%, so that it has a lattice constant intermediate between that of GaAs substrate and InP substrate. The InGaP substrate should have an In content larger than 49% and smaller than 100%, so that it has a lattice constant intermediate between that of GaAs substrate and that of InP substrate. This embodiment employs a GaAs substrate.

On the substrate 1 is placed the buffer layer 2, which is intended for lattice matching between the substrate 1 and those layers 3 to 10 to be formed thereon by epitaxial growth. In other words, the buffer layer 2 permits the defect-free epitaxial growth of those layers 3 to 10 differing in lattice constant from the substrate 1.

The buffer layer 2 mentioned above may be formed from any of InP, InGaAs, InAlAs, and InGaP. It gradually varies in composition in going upward (from the side adjacent to the substrate 1 to the side adjacent to the subcollector layer 3). The variation of the composition is established according to the composition and lattice constant of the substrate 1 and the composition and lattice constant of those layers 3 to 10 to be formed on the substrate 1.

Those layers 3 to 10, which are formed on the substrate 1 with the buffer layer 2 interposed between them, have the same lattice constant as the base layer 6. The following description is concerned first with the structure of the base layer 6 and then sequentially with the structure of the subcollector layer 3, the collector layer 4, the emitter layer 8, the first contact layer 9, the second contact layer 10, the first graded layer 5, and the second graded layer 7.

The base layer 6 is formed from p-type InGaAs having an In content larger than 0% and smaller than 53%. The In content in the base layer of InGaAs is determined according to performance (high-speed operation) and current gain required of the semiconductor device (D-HBT). In other words, the larger the In content, the higher the operating speed, and the smaller the In content, the greater the current gain. For a compromise between high-speed operation and high current gain, the In content in the base layer 6 should preferably be 30% to 40%.

It is assumed that the base layer 6 is formed from p-type InGaAs with an In content of 40% and a lattice constant intermediate between that of GaAs and that of InP. It is also assumed that the base layer 6 has a thickness ranging from 20 nm to 100 nm, say, 75 nm. The p-type InGaAs contains carbon (C) atoms as an impurity as many as $5 \times 10^{18}$ cm$^{-3}$ to $4 \times 10^{19}$ cm$^{-3}$, say, $2 \times 10^{19}$ cm$^{-3}$.

Once the structure of the base layer 6 is established as mentioned above, the structure of the other layers is established as follows.

The subcollector layer 3 on the buffer layer 2 is formed from n-type InGaAs having the same lattice constant as the base layer 6. In other words, the subcollector layer 3 is formed from InGaAs which has the same composition as that used for the base layer 6 but is doped with an n-type impurity. In this embodiment, the subcollector layer 3 is formed from n-type InGaAs with an In content of 40% and it has a thickness ranging from 100 nm to 500 nm, say, 300 nm. The InGaAs contains Si atoms as an n-type impurity as many as $5 \times 10^{18}$ cm$^{-3}$ to $2 \times 10^{19}$ cm$^{-3}$, say, $1 \times 10^{19}$ cm$^{-3}$.

The collector layer 4 on the subcollector layer 3 is formed from n-type InGaP having the same lattice constant as the base layer 6. Therefore, the In content in the collector layer 4 is larger than 49% and smaller than 100%, preferably in the range of about 77% to about 88%. In this embodiment, the collector layer 4 is formed from InGaP with an In content of 87%, so that it has the same lattice constant as the base layer 6 formed from InGaAs with an In content of 40%. It has a thickness ranging from 200 nm to 600 nm, say, 450 nm. The InGaP contains Si atoms as an n-type impurity as many as $1 \times 10^{15}$ cm$^{-3}$ to $5 \times 10^{16}$ cm$^{-3}$, say, $2 \times 10^{16}$ cm$^{-3}$.

The emitter layer 8 above the base layer 6 is formed from n-type InGaP having the same lattice constant as the base layer 6. Therefore, the In content in the emitter layer 8 is larger than 49% and smaller than 100%, preferably in the range of 77% to 88%. In this embodiment, the emitter layer 8 is formed from InGaP with an In content of 87%, so that it has the same lattice constant as the base layer 6 formed from InGaAs with an In content of 40%. It has a thickness ranging from 20 nm to 100 nm, say, 60 nm. The InGaP contains Si atoms as an n-type impurity as many as $1 \times 10^{16}$ cm$^{-3}$ to $1 \times 10^{18}$ cm$^{-3}$, say, $5 \times 10^{17}$ cm$^{-3}$.

The first contact layer 9 on the emitter layer 8 is formed from n-type InGaP having the same In content as the emitter layer 8, and it has a higher concentration of n-type impurity than the emitter layer 8. Therefore, the InGaP with an In content of 87% contains Si atoms as an n-type impurity as many as $5 \times 10^{18}$ cm$^{-3}$ to $3 \times 10^{19}$ cm$^{-3}$, say, $1 \times 10^{19}$ cm$^{-3}$. Its thickness ranges from 10 nm to 100 nm, say, 50 nm.

The second contact layer 10 on the first contact layer 9 is formed from n-type InGaAs having the same In content and lattice constant as the base layer 6, and it has a thickness ranging from 10 nm to 100 nm, say, 75 nm. The InGaAs contains Si atoms as an n-type impurity as many as $5 \times 10^{18}$ cm$^{-3}$ to $3 \times 10^{19}$ cm$^{-3}$, say, $1 \times 10^{19}$ cm$^{-3}$.

The first graded layer 5, which is interposed between the collector layer 4 and the base layer 6, is formed from n-type InGaAsP which has the same lattice constant as the base layer 6. The first graded layer 5 has a gradually varying composition so that the discontinuity of the conduction band disappears between the collector layer 4 and the base layer 6. The composition varies in such a way that the As content decreases in going to the collector layer 4 of InGaP and the P content decreases in going to the base layer 6 of InGaAs. The composition at the interface with the collector layer 4 is continuous with that of the collector layer 4 of InGaP, and the composition at the interface with the base layer 6 is continuous with that of the base layer 6 of InGaAs.

In the case where the collector layer 4 is formed from InGaP with an In content of 87% and the base layer 6 is formed from InGaAs with an In content of 40%, for example, as mentioned above, the first graded layer 5 is constructed such that the In content therein gradually decreases from 87% to 40% and the As content therein gradually increases from 0% to 100% in going from the side adjacent to the collector layer 4 to the side adjacent to the base layer 6.

The first graded layer 5 constructed in such a way should have a thickness ranging from 20 nm to 100 nm, say, 45 nm. It should contain Si atoms as an n-type impurity as many as $1 \times 10^{15}$ cm$^{-3}$ to $5 \times 10^{16}$ cm$^{-3}$, say, $2 \times 10^{16}$ cm$^{-3}$.

The second graded layer 7, which is interposed between the base layer 6 and the emitter layer 8, is also formed from n-type InGaAsP which has the same lattice constant as the base layer 6, as in the case of the first graded layer 5. The second graded layer 7 has a gradually varying composition so that the discontinuity of the conduction band disappears between the base layer 6 and the emitter layer 8. The composition varies in such a way that the As content decreases in going to the emitter layer 8 of InGaP and the P content decreases in going to the base layer 6 of InGaAs. The composition at the interface with the emitter layer 8 is continuous with that of the emitter layer 8 of InGaP, and the composition at the interface with the base layer 6 is continuous with that of the base layer 6 of InGaAs.

In the case where the emitter layer 8 is formed from InGaP with an In content of 87% and the base layer 6 is formed from InGaAs with an In content of 40%, for example, as mentioned above, the second graded layer 5 is constructed such that the In content therein gradually increases from 40% to 87% and the As content therein gradually decreases from 100% to 0% in going from the side adjacent to the base layer 6 to the side adjacent to the emitter layer 8.

The second graded layer 7 constructed in such a way should have a thickness ranging from 5 nm to 50 nm, say, 10 nm. It should contain Si atoms as an n-type impurity as many as $1 \times 10^{15}$ cm$^{-3}$ to $5 \times 10^{16}$ cm$^{-3}$, say, $2 \times 10^{16}$ cm$^{-3}$.

The semiconductor device (D-HBT) constructed as mentioned above has the base layer 6 which is formed from InGaAs with an In content smaller than 53%. In other words, the ordinary D-HBT of InP type formed on the InP substrate has the base layer formed from InGaAs with an In content of 53%, whereas the D-BHT according to the present invention has the base layer formed from InGaAs with a smaller In content. The base layer 6 with such an In content is realized by forming the collector layer 4 and the emitter layer 8, which hold the base layer 6 between them, from InGaP, so that the collector layer 4 and the emitter layer 8 have the same lattice constant as the base layer 6.

The base layer with an In content smaller than 53% has a lower probability of recombination than the base layer of the conventional D-HBT of InP type formed on an InP substrate, which leads to an increased current gain. It also maintains a higher value of carrier mobility than the D-HBT with a base layer of GaAs. This is because InGaAs constituting the base layer permits its coefficient of Auger recombination to approach that of GaAs as its In content decreases.

Therefore, as compared with the conventional D-HBT of InGaAs/InP type formed on the InP substrate, the semiconductor device according to an embodiment achieves a higher current gain while maintaining the high-speed operation.

Those layers 3 to 10 are formed from InGaAs with an In content smaller than 53% so that they have the same lattice constant as the base layer 6. The result in this case is that the epitaxially grown layers 3 to 10 have a lattice constant closer to that of the substrate 1 of GaAs than in the case where the base layer is formed from InGaAs with an In content of 53%. In other words, the degree of lattice mismatching is smaller between the GaAs substrate 1 (in the form of large wafer) and those layers 3 to 10 than between the InP substrate and those layers 3 to 10. Thus, the buffer layer 2 placed on the GaAs substrate 1 permits those layers 3 to 10 to be grown without crystal defects. This also holds true in the case where the substrate is formed from InGaAs.

The foregoing permits the semiconductor device to be formed on a larger wafer at a lower cost.

The D-HBT constructed as mentioned above has the collector layer 4 formed from InGaP and hence it is free of the reverse leakage current that occurs at the pn junction when an electric field is applied, unlike the conventional D-HBT of InP type which has the collector layer of InP.

Figure 2:
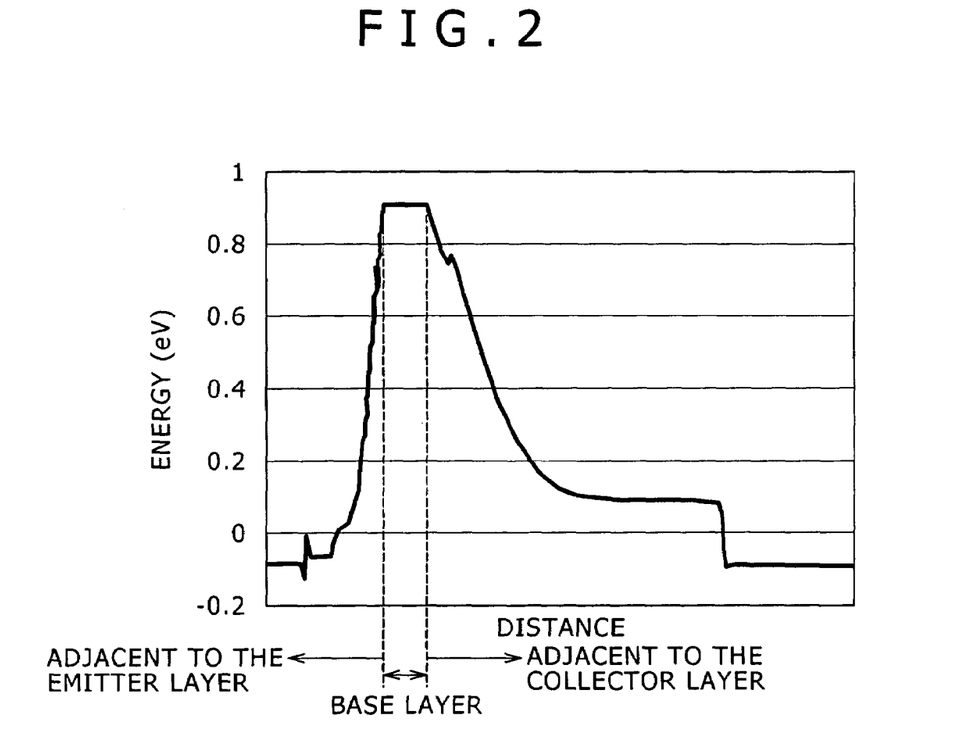
FIG. 2 is a diagram showing the profile of the conduction band in the HBT semiconductor device according to the first embodiment.

FIG. 2 is a diagram showing the profile of the conduction band in the D-HBT constructed as mentioned above. The diagram is based on the results of calculations performed by using the two-dimensional device simulator (DESSIS) from ISE (Integrated Systems Engineering). It is noted from FIG. 2 that the discontinuity of the conduction bands between the collector layer 4 and the base layer 6 disappears owing to the first graded layer 5 interposed between them and the discontinuity of the conduction bands between the base layer 6 and the emitter layer 8 disappears owing to the second graded layer 7 interposed between them.

The foregoing results suggest that the graded layers 5 and 7 keep power consumption low.

The Second Embodiment

Figure 3:
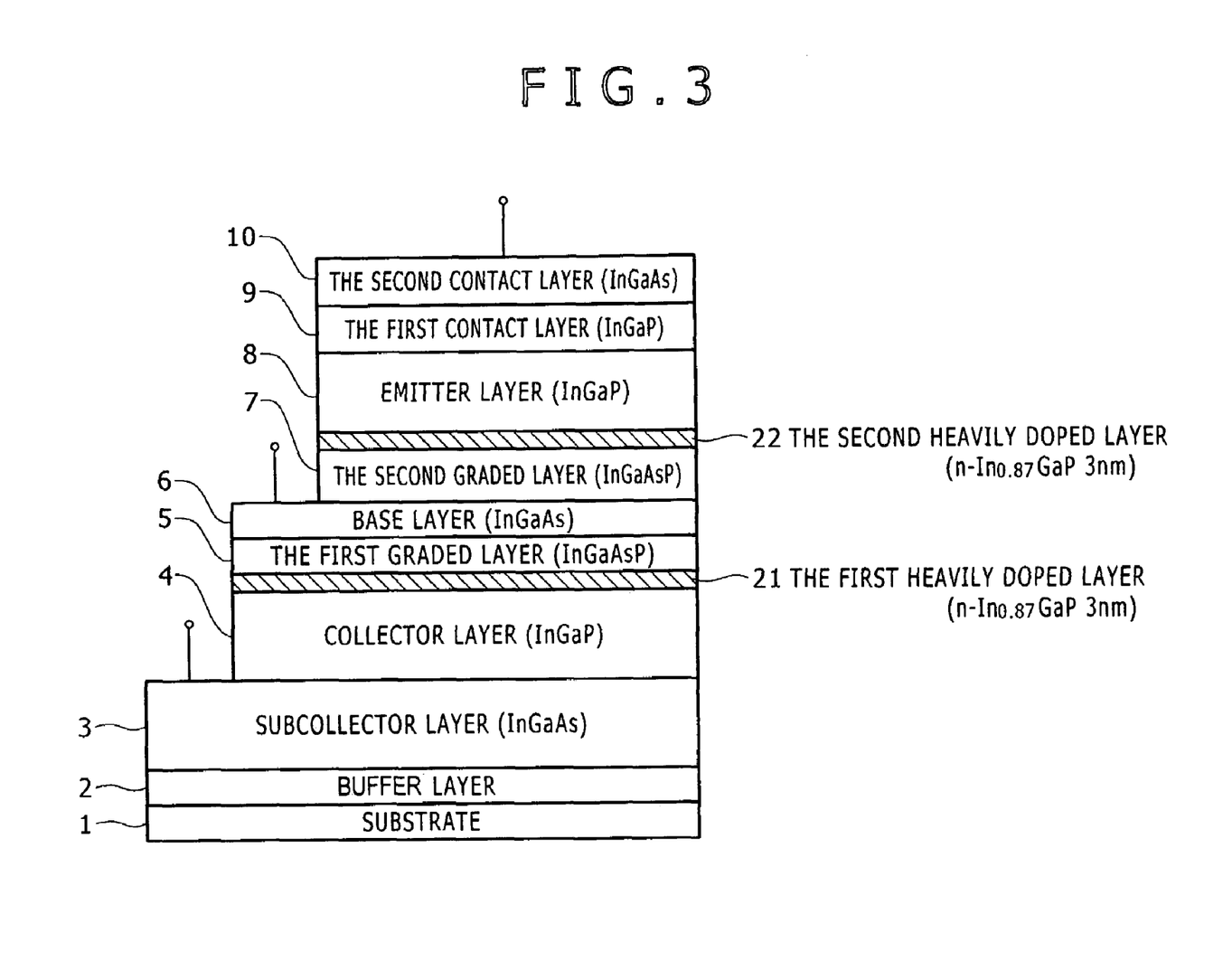
FIG. 3 is a sectional view showing the structure of the semiconductor device according to the second embodiment.

FIG. 3 is a sectional view showing the structure of the semiconductor device according to the second embodiment. This semiconductor device differs from the semiconductor device (shown in FIG. 1) according to the first embodiment only in that the first heavily doped layer 21 is interposed between the collector layer 4 and the first graded layer 5 and the second heavily doped layer 22 is interposed between the second graded layer 7 and the emitter layer 8.

The first heavily doped layer 21 interposed between the collector layer 4 and the first graded layer 5 is formed from n-type InGaP which is identical in In content with that used for the collector layer 4 (so that it has the same lattice constant as the base layer 6) but has a higher content of n-type impurity than the collector layer 4. Thus, if the collector layer 4 is formed in the same way as in the first embodiment, the first heavily doped layer 21 is formed from InGaP with an In content of 87% which contains as an n-type impurity Si atoms as many as $5 \times 10^{17}$ cm$^{-3}$ to $5 \times 10^{18}$ cm$^{-3}$, say, $1.5 \times 10^{18}$ cm$^{-3}$. It has a thickness ranging from 1 nm to 5 nm, say, 3 nm.

On the other hand, the second heavily doped layer 22 interposed between the second graded layer 7 and the emitter layer 8 is formed from n-type InGaP which is identical in In content with that used for the emitter layer 8 (so that it has the same lattice constant as the base layer 6) but has a higher content of n-type impurity than the emitter layer 8. Thus, if the emitter layer 8 is formed in the same way as in the first embodiment, the second heavily doped layer 22 is formed from InGaP with an In content of 87% which contains as an n-type impurity Si atoms as many as $2 \times 10^{18}$ cm$^{-3}$ to $5 \times 10^{18}$ cm$^{-3}$, say, $4 \times 10^{18}$ cm$^{-3}$. It has a thickness ranging from 1 nm to 5 nm, say, 3 nm.

Figure 4:
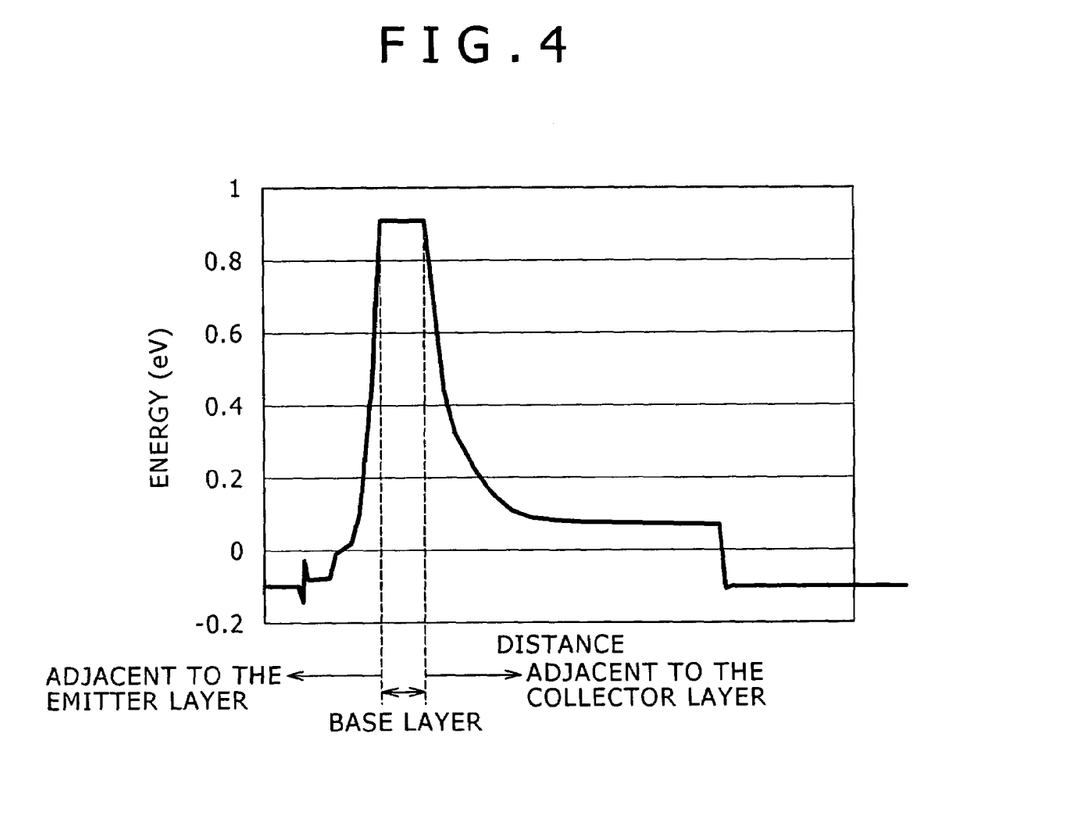
FIG. 4 is a diagram showing the profile of the conduction band in the HBT semiconductor device according to the second embodiment.

FIG. 4 is a diagram showing the profile of the conduction band in the D-HBT constructed as mentioned above. As in FIG. 2, the diagram is based on the results of calculations performed by using the two-dimensional device simulator (DESSIS) from ISE (Integrated Systems Engineering). It is noted from FIG. 4 that the discontinuity of the conduction bands between the collector layer 4 and the first graded layer 5 disappears and becomes smoother (as compared with the first embodiment) owing to the first heavily doped layer 21 interposed between them and the discontinuity of the conduction bands between the second graded layer 7 and the emitter layer 8 disappears and becomes smoother (as compared with the first embodiment) owing to the second heavily doped layer 22 interposed between them.

The foregoing results suggest that owing to the heavily doped layers 21 and 22, the second embodiment saves power consumption more than the first embodiment.

The Third Embodiment

Figure 5:
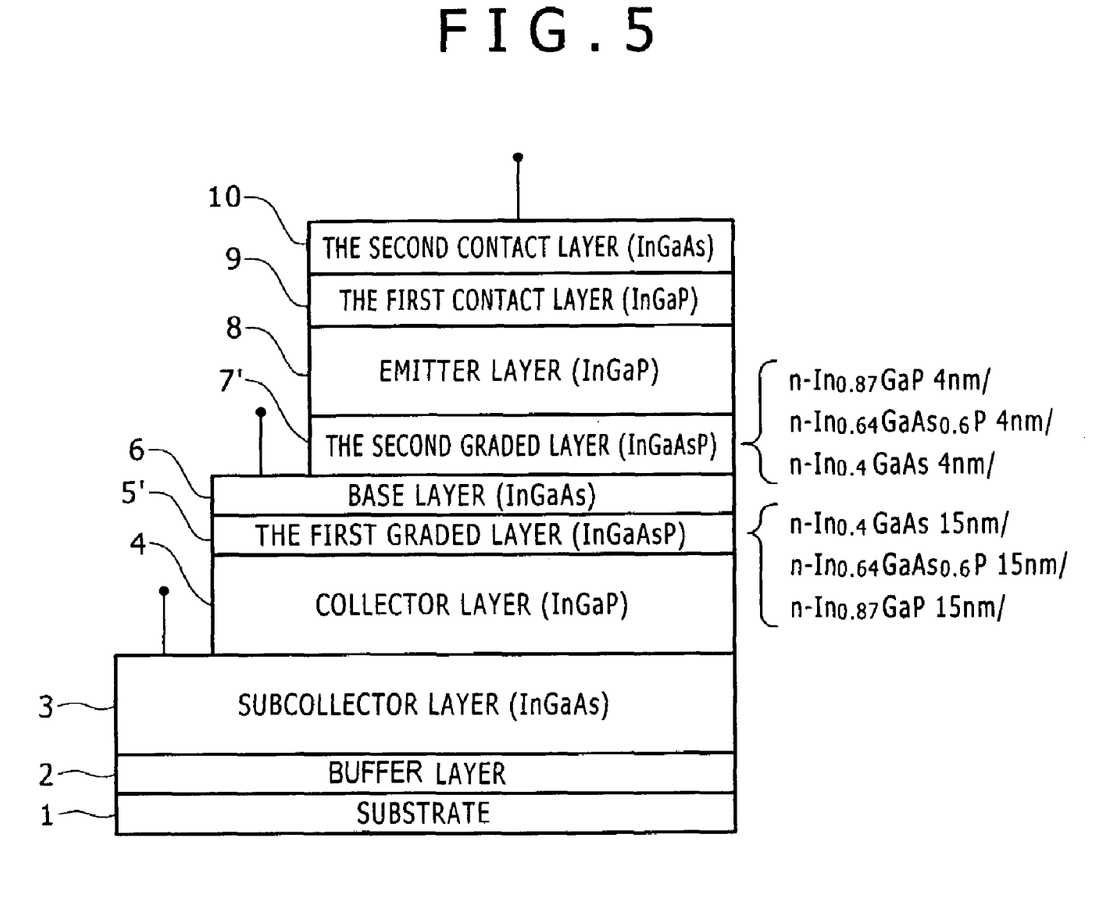
FIG. 5 is a sectional view showing the structure of the semiconductor device according to the third embodiment.

FIG. 5 is a sectional view showing the structure of the semiconductor device according to the third embodiment. This semiconductor device differs from the semiconductor device (shown in FIG. 1) according to the first embodiment only in that the first graded layer 5' and the second graded layer 7' stepwise vary in composition.

The first graded layer 5', which is interposed between the collector layer 4 and the base layer 7, has a specific impurity concentration and a specific thickness as in the first graded layer in the first embodiment. It is formed from n-type InGaAsP and has the same lattice constant as the base layer 6. The InGaAsP varies in As content and P content so that the discontinuity of the conduction bands disappears between the collector layer 4 and the base layer 6. The composition of the InGaAsP varies stepwise (in three or more steps) so that the composition and lattice constant at the interface are continuous with the collector layer 4 and with the base layer 6.

The stepwise variation in composition of the first graded layer 5' may be realized, for example, by forming (upward from the collector layer 4) a 15 nm thick layer of $In_{0.87}GaP$, a 15 nm thick layer of $In_xGa_{1-x}As_yP_{1-y}$ (0.53<x<0.87, x=1−0.6y, e.g., x=0.64, y=0.60), and a 15 nm thick layer of InGaAs with an In content of 40%.

On the other hand, the second graded layer 7', which is interposed between the base layer 7 and the emitter layer 8, has a specific impurity concentration and a specific thickness as in the second graded layer in the first embodiment. It is formed from n-type InGaAsP and has the same lattice constant as the base layer 6. The InGaAsP varies in As content and P content so that the discontinuity of the conduction bands disappears between the base layer 6 and the emitter layer 8. The composition of the InGaAsP varies stepwise (in three or more steps) so that the composition and lattice constant at the interface are continuous with the base layer 6 and the emitter layer 8.

The stepwise variation in composition of the second graded layer 7' may be realized, for example, by forming (upward from the base layer 6) a 4 nm thick layer of InGaAs with an In content of 40%, a 4 nm thick layer of $In_xGa_{1-x}As_yP_{1-y}$ (0.40<x<0.87, x=1−0.6y, e.g., x=0.64, y=0.60), and a 4 nm thick layer of $In_{0.87}GaP$.

Figure 6:
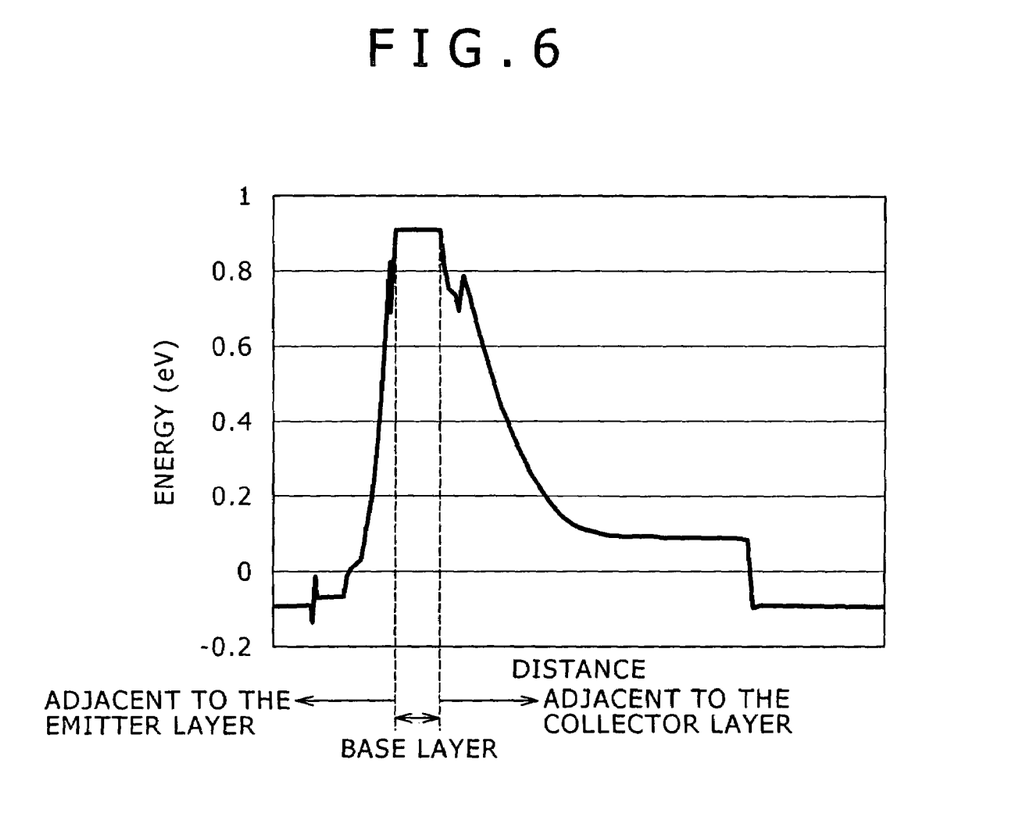
FIG. 6 is a diagram showing the profile of the conduction band in the HBT semiconductor device according to the third embodiment.

FIG. 6 is a diagram showing the profile of the conduction band in the D-HBT constructed as mentioned above. As in FIG. 2, the diagram is based on the results of calculations performed by using the two-dimensional device simulator (DESSIS) from ISE (Integrated Systems Engineering). It is noted from FIG. 6 that the discontinuity of the conduction bands between the collector layer 4 and the base layer 6 and between the base layer 6 and the emitter layer 8 disappears and becomes smooth (as in the first embodiment) owing to the first graded layer 5' and the second graded layer 7' which stepwise vary in composition. The foregoing leads to the saving of power consumption.

The Fourth Embodiment

Figure 7:
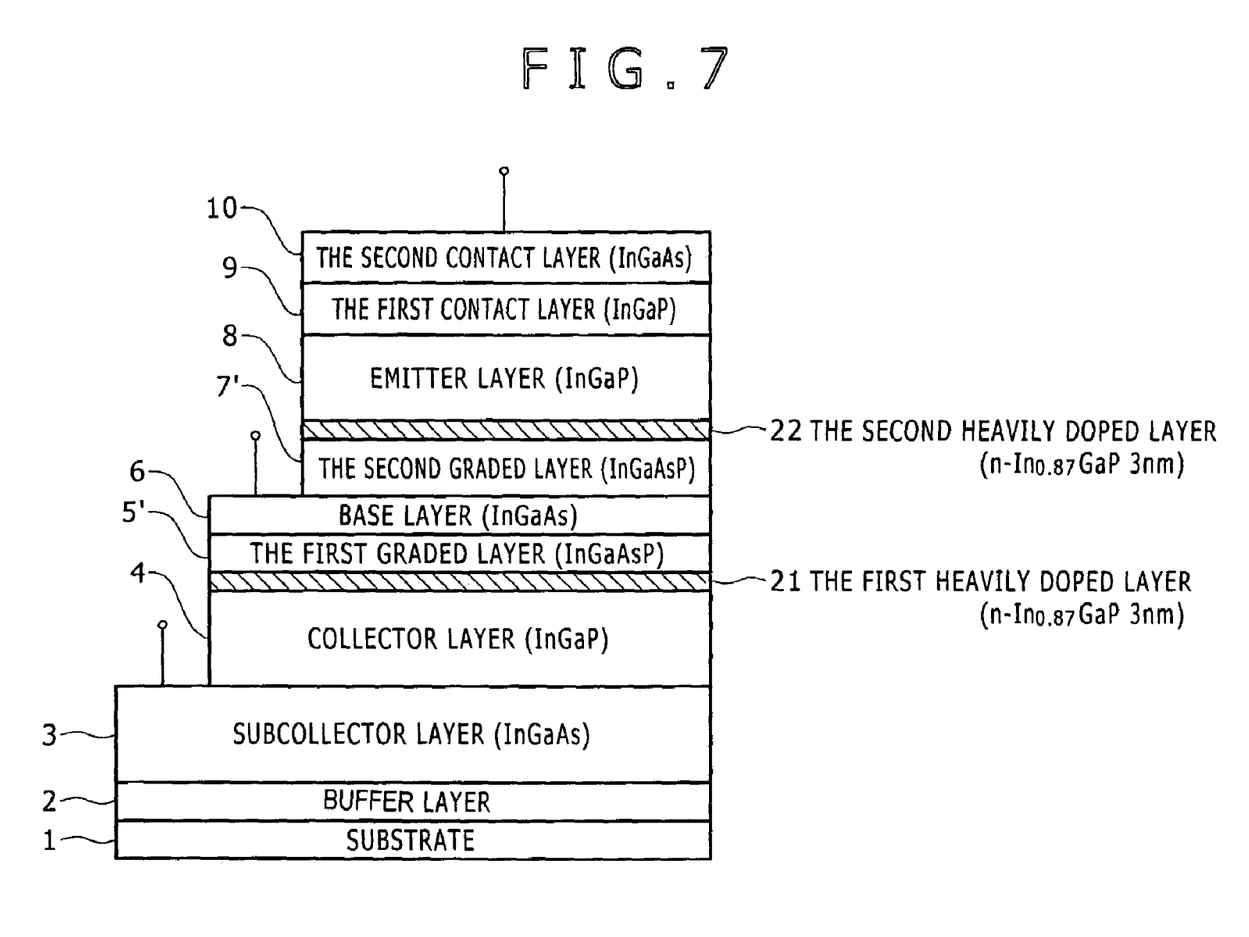
FIG. 7 is a sectional view showing the structure of the semiconductor device according to the fourth embodiment.

FIG. 7 is a sectional view showing the structure of the semiconductor device according to the fourth embodiment. This semiconductor device differs from the one (shown in FIG. 5) according to the third embodiment only in that the heavily doped layers 21 and 22 (the same ones as mentioned in the second embodiment) are interposed respectively between the collector layer 4 and the first graded layer 5' and between the second graded layer 7' and the emitter layer 8.

Figure 8:
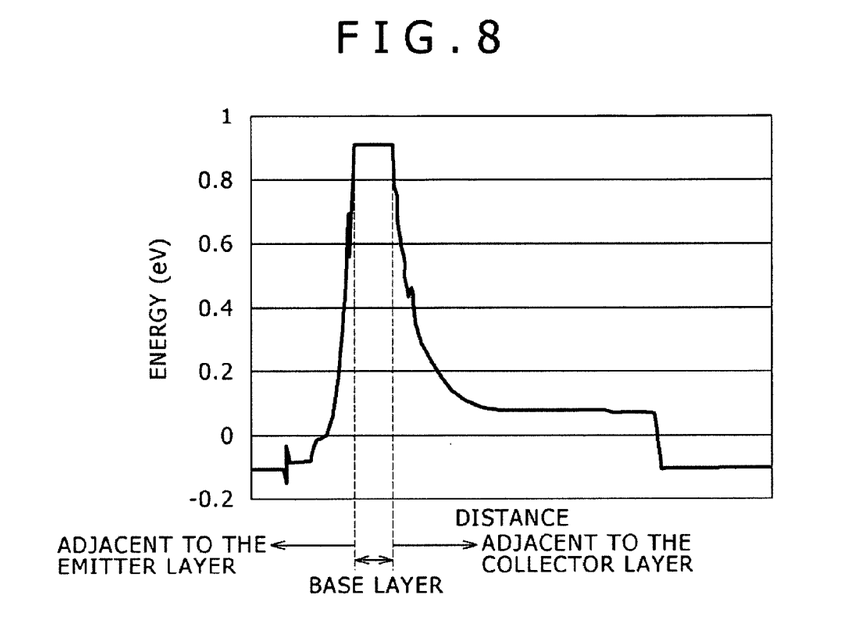
FIG. 8 is a diagram showing the profile of the conduction band in the HBT semiconductor device according to the fourth embodiment.

FIG. 8 is a diagram showing the profile of the conduction band in the D-HBT constructed as mentioned above. As in FIG. 2, the diagram is based on the results of calculations performed by using the two-dimensional device simulator (DESSIS) from ISE (Integrated Systems Engineering). It is noted from FIG. 8 that the discontinuity of the conduction bands between the collector layer 4 and the first graded layer 5' and between the second graded layer 7' and the emitter layer 8 base layer 6 disappears and becomes smoother (as compared with the third embodiment) owing to the first heavily doped layer 21 and the second heavily doped layer 22 interposed respectively between them.

It should be understood by those skilled in the art that various modifications, combinations, sub-combinations and alterations may occur depending on design requirements and other factors insofar as they are within the scope of the appended claims or the equivalents thereof.

The invention is claimed as follows:

1. A semiconductor device comprising:
   an emitter layer formed from InGaP;
   a collector layer formed from InGap;
   a base layer formed from InGaAs and held between the emitter layer and the collector layer, said base layer having an In content less than about 53%,
   wherein the In content of the emitter layer and the collector layer is sufficient to make the lattice constant of said emitter layer and said collector layer substantially equal to the lattice constant of said base layer; and
   a graded layer formed from InGaAsP at least between the base layer and the collector layer and between the base layer and the emitter layer, wherein said InGaAsP has a composition which varies in As content and P content so as to eliminate a discontinuity of conduction bands between these layers.

2. The semiconductor device as defined in claim 1, wherein the graded layer varies in composition such that it retains the same lattice constant as the base layer.

3. The semiconductor device as defined in claim 1, which further comprises a layer of InGaP interposed between at least either of the collector layer and emitter layer and the graded layer, said InGaP being doped with an impurity heavier than its adjacent collector layer or emitter layer.

4. The semiconductor device as defined in claim 1, wherein the graded layer having a thickness continuously varies in composition along its thickness direction.

5. The semiconductor device as defined in claim 1, wherein the graded layer having a thickness stepwise varies in composition along its thickness direction.

6. The semiconductor device as defined in claim 1, wherein the collector layer, base layer, and emitter layer in laminate structure are formed on a substrate of GaAs, InGaAs, InP, or InGaP.

7. The semiconductor device as defined in claim 6, wherein a buffer layer is formed between the substrate and the laminate structure, for lattice matching between the substrate and the laminate structure which differ from each other in lattice constant.

* * * * *